United States Patent
Thrap

(10) Patent No.: US 7,880,449 B2
(45) Date of Patent: Feb. 1, 2011

(54) CAPACITOR START-UP APPARATUS AND METHOD WITH FAIL-SAFE SHORT CIRCUIT PROTECTION

(75) Inventor: Guy C. Thrap, Del Mar, CA (US)

(73) Assignee: Maxwell Technologies, Inc., San Diego ( * ) Notice: Subject to any disclaimer, the term of this patent is extended or adjusted under 35 U.S.C. 154(b) by 1035 days.

(21) Appl. No.: 11/670,802

(22) Filed: Feb. 2, 2007

(65) Prior Publication Data
US 2007/0120549 A1      May 31, 2007

Related U.S. Application Data

(62) Division of application No. 10/821,415, filed on Apr. 9, 2004, now Pat. No. 7,180,277.

(51) Int. Cl.
*G05F 1/613* (2006.01)
(52) U.S. Cl. ..................................... 323/225
(58) Field of Classification Search ................ 323/220, 323/223, 225, 226, 270–289, 364
See application file for complete search history.

(56) References Cited

U.S. PATENT DOCUMENTS

| | | | |
|---|---|---|---|
| 5,661,348 A * | 8/1997 | Brown | 307/43 |
| 5,675,193 A | 10/1997 | Lee | |
| 6,166,924 A * | 12/2000 | Assow | 363/20 |
| 6,320,362 B1 * | 11/2001 | Baek et al. | 323/289 |
| 6,608,520 B1 | 8/2003 | Miyazaki | |
| 6,648,086 B1 | 11/2003 | Schulte | |
| 6,708,757 B2 | 3/2004 | Hebel et al. | |
| 6,765,375 B1 | 7/2004 | Tu et al. | |
| 6,771,119 B2 | 8/2004 | Ochi | |
| 7,091,709 B2 | 8/2006 | Suzuki | |
| 2003/0067281 A1 | 4/2003 | Wilk et al. | |
| 2006/0076937 A1 * | 4/2006 | Achart | 323/267 |

FOREIGN PATENT DOCUMENTS

EP         1300933 A2      9/2003

OTHER PUBLICATIONS

International search report from corresponding PCT application PCT/US05/07738 dated Dec. 28, 2006.
IPRP from corresponding PCT application PCT/US05/07738 dated May 9, 2007.
Written Opinion from corresponding PCT application PCT/US05/07738 dated Dec. 28, 2006.

* cited by examiner

*Primary Examiner*—Matthew V Nguyen
(74) *Attorney, Agent, or Firm*—Oppedahl Patent Law Firm LLC

(57) ABSTRACT

Electronic circuits couple energy storage devices, such as double layer capacitors or rechargeable battery cells, to a power supply output, thereby improving noise suppression and extending ride-through capability of the power supply. In a typical circuit, an energy storage device is coupled in series with a switch that controls the charging current into the energy storage device. The switch is controlled by a comparator that receives a signal related to the voltage level of the power supply. In some embodiments, the comparator also receives a feedback signal related to a charging current flowing into the energy storage device. The circuit is configured so that the switch limits the charging current to a predetermined current level, or does not allow the charging current to flow until the output voltage of the power supply reaches a predetermined voltage level.

3 Claims, 6 Drawing Sheets

CAPACITOR START-UP APPARATUS AND METHOD WITH FAIL-SAFE SHORT CIRCUIT PROTECTION

CROSS-REFERENCE TO RELATED APPLICATIONS

The present invention is a divisional application of and claims the benefit of and priority from the prior-filed U.S. Nonprovisional patent application Ser. No. 10/821,415, filed Apr. 9, 2004, entitled "Capacitor Start-Up Apparatus And Method With Fail-Safe Short Circuit Protection," which is hereby incorporated by reference in its entirety for all that it discloses and teaches.

FIELD OF THE INVENTION

The present invention relates generally to circuits for filtering voltages and enhancing power supply ride-through performance, and, more particularly, to current limiting circuits for controlling large capacitor charging currents.

BACKGROUND

Power supplies are ubiquitous devices present in electrical and electronic equipment. Typically, a power supply converts alternating current (AC) power into direct current (DC) power for use within the equipment. The AC power is generally delivered to the power supply at a relatively high voltage, for example, 120 VAC, while the DC power is generated within the power supply at one or more relatively low voltages, for example, 5 and 12 VDC. In some applications, the power converted by a power supply is received from a DC source, but at a voltage that cannot be used directly by the equipment. For example, the input power may come from a source of voltage that is too high or too low for direct use within the equipment. The power supply then regulates the voltage down to the needed level, or performs DC-to-DC transformation, either stepping the DC voltage up or down, as needed.

Ideally, the DC voltage delivered by a power supply is stable and does not have any AC components. In practice, however, the DC voltage has some AC components. The most common source of the AC components is feed through of the AC voltage, such as the 60 Hz spectral components in North America or the 50 Hz frequency common in Europe. Another source of AC noise is the equipment using the DC power. Still another source of the noise is radio frequency interference. But whatever the source of the AC noise on the power supply output, it is desirable to reduce its magnitude. A power supply's ability to suppress the AC noise on its output is an important performance characteristic of the supply.

Another important measure of power supply performance is the capability to continue delivering stable DC power during disturbances on the AC power line that feeds the power supply. This capability is sometimes descriptively called "ride-through" capability, because it allows the equipment to perform as expected during AC power interruptions of short duration, or to power down in a controlled manner during such interruptions.

Large capacitors are often connected across DC power supply outputs to improve both AC noise suppression and ride-through capability. Capacitors perform these functions because they are reservoirs of electrical charges, and can absorb or supply the charges as required. The larger the capacitance of a given capacitor, the better it will suppress AC noise and the longer it will be able to supplement or replace DC power normally provided by the power supply. One type of capacitor that can provide large capacitance is that known to those skilled in the art as a double-layer capacitor. Double layer capacitors can provide previously unattainable large capacitance values in small form factor housings. For example, a 500 Farad double-layer capacitor can now be made to fit within a battery sized housing, including D-cell sized housings and the like.

Connecting a capacitor across a power supply output is not without its own set of problems. In the present context, we focus on three such problems. First, a capacitor may draw a large amount of electrical current on power-up, until the capacitor is sufficiently charged. This is problematic because the capacitor may keep The voltage of the power supply from reaching its nominal level for an excessive period of time. Power monitoring and power-on reset circuits, common in electronic equipment, may time-out before the voltage stabilizes at the nominal level, keeping the equipment in the reset mode or initiating another start-up sequence of the equipment. Even when the equipment can tolerate a prolonged start-up period, many users find additional waiting annoying. These problems become worse as capacitance is increased, because higher capacitance allows a capacitor to receive more charge and, therefore, more current from a power supply. Thus, when using high capacitance capacitors, for example, double-layer capacitors, high current draw needs to be considered during the design-in phase even more than before. It would also be preferable to avoid extensive start-up delays that use of high capacitance capacitors may cause.

Second, in some applications excessive current draw may disable the power supply. For example, large current drawn from a power supply can blow a fuse, trip an overload protection circuit, or cause permanent damage to internal components of the power supply. Excessive current draw may also damage the capacitor, causing it to leak, catch fire, or even explode, presenting a safety hazard. Therefore, it would be desirable to prevent excessive current draw and avoid such possibilities.

Third, a typical capacitor failure mode is a short circuit between capacitor terminals. With the capacitor installed across power supply output terminals, the failure would not only affect the AC noise suppression and ride-through capability of the power supply, but would also cause a catastrophic failure because the voltage level output by the power supply would likely fall precipitously, leaving the equipment powered by the supply without adequate power. It would be beneficial to prevent such catastrophic failures due to capacitor failures.

A need thus exists for methods and apparatus to prevent excessive start-up delays caused by charging output capacitors of power supplies. Another need exists to prevent excessive current draw that can disable power supplies during equipment start-up. Yet another need exists to prevent capacitor failures from causing catastrophic equipment failures. A further need exists to implement such solutions with high capacitance capacitors such as double-layer capacitors.

SUMMARY

The present invention is directed to circuits for coupling an energy storage device to an output of a power supply. One circuit in accordance with the invention includes a current-sensing resistor, and a switch with a pair of outputs and an input. The outputs of the switch are coupled in series with the energy storage device and with the current-sensing resistor, forming a series combination. The combination series is in turn coupled across the output of the power supply. In one embodiment, the energy storage device comprises high capacitance capacitors such as double-layer capacitors.

The input of the switch receives a switching signal that controls the state of the switch. When the switching signal is at a first level, the switch assumes a conducting (on) state with low resistance between the switch's outputs; when the switching signal is at a second level, the switch assumes a non-conducting (off) state with high resistance between the outputs of the switch.

The circuit further includes a differential high-gain device, such as a comparator or an operational amplifier. An output of the differential high-gain device is coupled to the input of the switch, so as to control the state of the switch and the charging current flowing through the switch and other components of the series combination. A non-inverting input of the differential high-gain device is biased by a control voltage generated, for example, by a voltage divider coupled across the outputs of the power supply. An inverting input of the differential high-gain device receives a feedback voltage generated by the charging current flowing through the current-sensing resistor.

The output of the differential high-gain device drives the input of the switch with the switching signal at the first level when the control voltage exceeds the feedback voltage by an input offset voltage of the differential high-gain device. The differential high-gain device drives the input of the switch with the switching signal at the second level when the feedback voltage exceeds the control voltage by the input offset voltage. In this way, the charging current that the energy storage device can draw from the power supply is limited to a level determined by the values of the current-sensing resistor, the resistors of the voltage divider, and the voltage level at the output of the power supply.

Another circuit in accordance with the invention includes a switch with a pair of outputs and an input. The switch's outputs are coupled in series with an energy storage device to form a first series combination, which combination is coupled across the output of the power supply. A switching signal at the input of the switch controls the state of the switch. The switch is turned on (assumes a conductive state) when the switching signal is at a first level; the switch is turned off (assumes a non-conducting state) when the switching signal is at a second level.

The circuit also includes a reference voltage source, for example, a temperature-compensated voltage reference, and first and second resistors coupled in series to form a second series combination. The second series combination is also coupled across the output of the power supply.

The circuit further includes a differential high-gain device, such as a comparator or an operational amplifier, providing the switching signal at its output. A non-inverting input of the differential high-gain device is coupled to the junction of the first and second resistors, while its inverting input receives a voltage reference signal from the reference voltage source. To add hysteresis to the circuit, a positive feedback resistor is coupled between the output and the non-inverting input of the differential high-gain device. With this arrangement of components, the circuit does not allow a charging current to flow into the energy storage device until the voltage at the output of the power supply reaches a voltage level determined by the voltage reference signal and the values of the first resistor, the second resistor, and the feedback resistor.

In one embodiment, a system for use with a power supply comprises two double-layer capacitors, the two double-layer capacitors operatively coupled to output terminals of the power supply, wherein each double-layer capacitor comprises a capacitance of greater than or equal to 1 Farad; a voltage balancing circuit; the voltage balancing circuit operatively coupled to the two double-layer capacitors to balance a voltage applied to the two capacitors by the power supply; and a current control device, the current control device including a feedback portion, the current control device coupled to output terminals of the power supply, wherein the current control device controls current flowing through the two double-layer capacitors according to a signal provided by the feedback portion. In one embodiment, the feedback portion provides a positive feedback signal. In one embodiment, the feedback portion provides a negative feedback signal.

In one embodiment, a circuit for coupling an energy storage device to an output of a first power supply comprises a current-sensing resistor; a switch comprising a pair of outputs coupled in series with the energy storage device and with the current-sensing resistor, and an input receiving a switching signal, the switch assuming a conducting state when the switching signal is at a first level, the switch assuming a non-conducting state when the switching signal is at a second level; a differential high-gain device comprising an output coupled to the input of the switch, a first input biased by a control voltage, and a second input receiving feedback voltage generated by a charging current flowing through the current-sensing resistor; wherein the output of the differential high-gain device drives the input of the switch with the switching signal at the first level when the control voltage exceeds the feedback voltage by an input offset voltage of the differential high-gain device, and the differential high-gain device drives the input of the switch with the switching signal at the second level when the feedback voltage exceeds the control voltage by the input offset voltage; and the current-sensing resistor, the switch, and the energy storage device are coupled across the output of the first power supply.

In one embodiment, a circuit for coupling an energy storage device to an output of a first power supply comprises a switch comprising a pair of outputs coupled in series with the energy storage device to form a series combination, the series combination being coupled across the output of the first power supply, and an input receiving a switching signal, the switch assuming a conducting state when the switching signal is at a first level, the switch assuming a non-conducting state when the switching signal is at a second level; a connection receiving a voltage reference signal; and a differential high-gain device comprising an output coupled to the input of the switch, a first input biased by a control voltage, and a second input receiving the voltage reference signal; wherein: the control voltage is monotonically related to a voltage appearing at the output of the first power supply so that the differential high-gain device drives the input of the switch with the switching signal at the first level when the control voltage exceeds the voltage reference signal by an input offset voltage of the differential high-gain device, and the differential high-gain device drives the input of the switch with the switching signal at the second level when the voltage reference signal exceeds the control voltage signal by the input offset voltage.

In one embodiment, a circuit for coupling an energy storage device to an output of a first power supply comprises a switch comprising a pair of outputs coupled in series with the energy storage device to form a first series combination, the first series combination being coupled across the output of the first power supply, and an input receiving a switching signal, the switch assuming a conducting state when the switching signal is at a first level, the switch assuming a non-conducting state when the switching signal is at a second level; a connection receiving a voltage reference signal; a first resistor and a second resistor coupled in series to form a second series combination comprising a junction of the first and second resistors, the second series combination being coupled across the output of the first power supply; a differential high-gain device comprising an output coupled to the input of the switch, a non-inverting input coupled to the junction of the first and second resistors, and an inverting input receiving the voltage reference signal; and a positive feedback resistor coupled between the output of the differential high-gain device and the non-inverting input of the differential high-gain device.

In one embodiment, a method for coupling an energy storage device to an output of a power supply comprises steps of: coupling the energy storage device in series with a switch controllable by a switching signal; generating a feedback signal representing current flowing into the energy storage device; comparing the feedback signal to a predetermined control signal; and generating the switching signal to turn off the switch when the comparing step indicates that the current is not lower than a predetermined level.

These and other embodiments, features, advantages, and aspects of the present invention will be better understood with reference to the following description, drawings, and appended claims.

DETAILED DESCRIPTION

Figure 1:
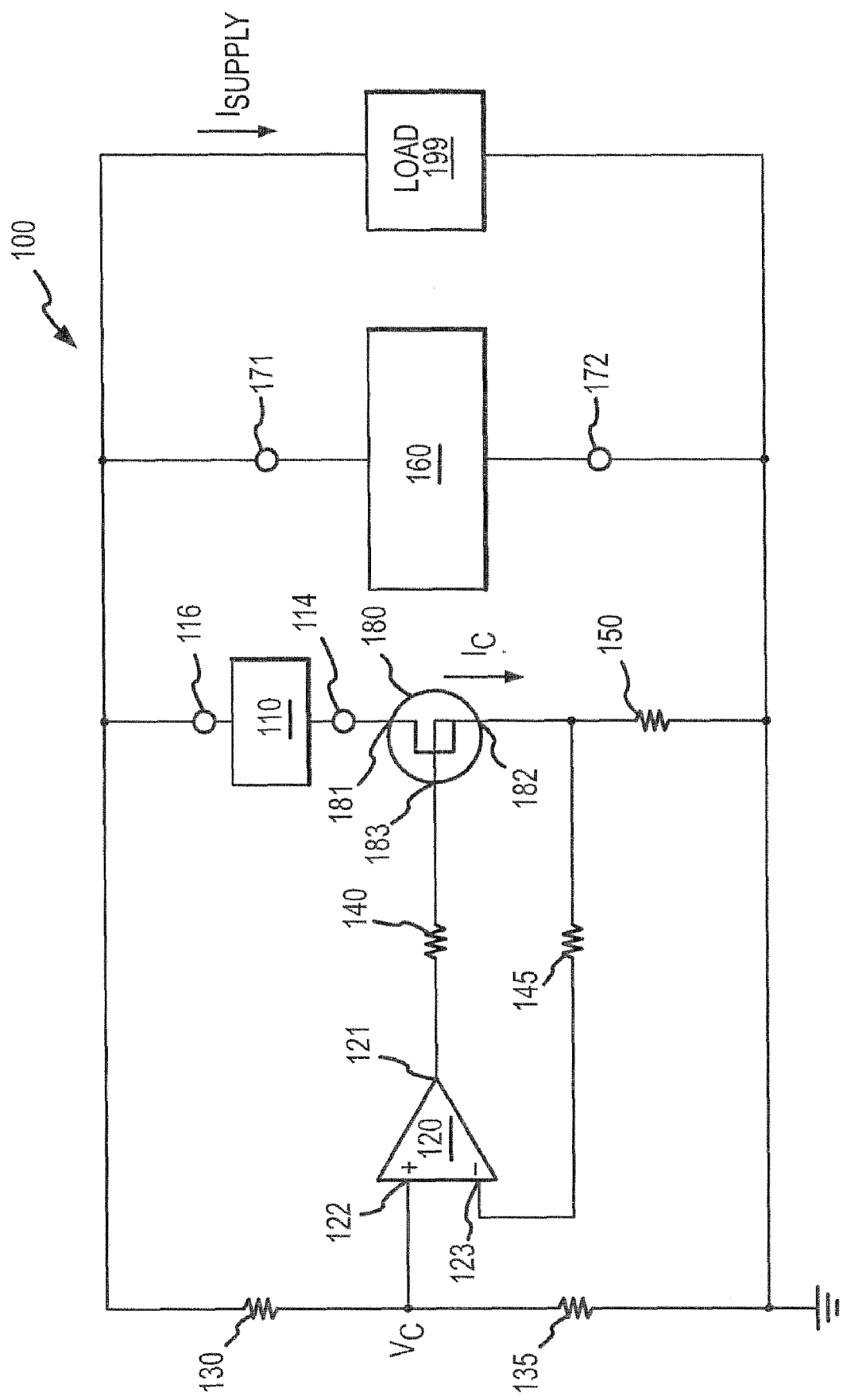
FIG. 1 is a high-level illustration of a circuit for limiting current flowing into a device coupled across a power supply output, in accordance with the present invention.

Reference will now be made in detail to several embodiments of the invention that are illustrated in the accompanying drawings. Wherever possible, same or similar reference numerals are used in the drawings and the description to refer to the same or like parts. The drawings are in a simplified form and not to precise scale. For purposes of convenience and clarity only, directional terms, such as top, bottom, left, right, up, down, over, above, below, beneath, rear, and front may be used with respect to the accompanying drawings. These and similar directional terms should not be construed to limit the scope of the invention in any manner. In addition, the words couple, connect, and similar terms with their inflectional morphemes are used interchangeably, unless the difference is noted or made otherwise clear from the context. These words and expressions do not necessarily signify direct connections, but include connections through mediate components and devices.

FIG. 1 is a high-level illustration of a circuit 100 in accordance with the present invention. The circuit 100 includes terminals 171 and 172 that couple the circuit 100 to a power supply 160, and terminals 114 and 116 that connect to an energy storage device 110. In one variant of the circuit 100, the energy storage device 110 is a double layer capacitor (also known as ultracapacitors and super capacitors). Double-layer capacitors store electrostatic energy in a polarized electrode/electrolyte interface layer. Double-layer capacitors include two electrodes, which are separated from contact by a porous separator. The separator prevents an electronic (as opposed to an ionic) current from shorting the two electrodes. Both the electrodes and the porous separator are immersed in an electrolyte, which allows flow of the ionic current between the electrodes and through the separator. At the electrode/electrolyte interface, a first layer of solvent dipole and a second layer of charged species is formed (hence, the name "double-layer" capacitor). Double-capacitors enable that individual capacitor cells may be designed with capacitance on the order of thousands of Farads. In one embodiment, individual double-layer capacitor cells can be connected in parallel to further increase capacitance. Present double-layer capacitor technology limits nominal operating voltages of double-layer capacitors to below about 3.0 volts. Higher operating voltages are possible, but at such voltages undesirable destructive breakdown may begin to appear. Those skilled in the art will identify that increased operating voltage at a given high capacitance, as can be provided by a double-layer capacitor, can be achieved by connecting two or more double-layer capacitors in series.

Resistors 130 and 135 form a voltage divider between positive and negative power supply rails that connect to the terminals 171 and 172. The voltage divider sets a control voltage ($V_c$) at the junction of the two resistors, which voltage is monotonically related to the voltage difference between the terminals 171 and 172. The divider is also coupled to a non-inverting input 122 of a differential high-gain device 120, biasing the input 122 with the control voltage. Output 121 of the device 120 drives, through a current-limiting resistor 140, an input 183 of a switching device 180. The switching device 180—a transistor switch in the illustrated embodiment—assumes a conductive state when the voltage at its input 183 exceeds a certain threshold. For example, the device 180 assumes a conductive state when the output 121 of the differential high-gain device 120 is at a high voltage level. The differential high-gain device 120 drives its output 121 to a high voltage level when the voltage at the inverting input 123 is lower than the control voltage $V_c$ at the non-inverting input 122. When the voltage, at the input 123 is higher than the voltage at the input 122, the output 121 is driven to a low voltage level.

The control voltage $V_c$ at the input 122 is equal to the voltage $V_{cc}$ of the supply 160 (5 volts, for example) multiplied by resistance value $R_{135}$ of the resistor 135, and divided by the combined resistance values $R_{130}$ and $R_{135}$ of the resistors 130 and 135:

$$V_c = V_{cc} * \frac{R_{135}}{(R_{130} + R_{135})}.$$

(Note that here and elsewhere in this document; $R_N$ designates resistance value of a resistor designated by numeral N.)

As long as the control voltage $V_c$ exceeds the voltage at the inverting input 123 of the device 120, the output 121 drives the input 183 of the switching device 180 with a voltage sufficient to turn on or saturate the switching device 180. Current $I_c$ through the switching device 180 charges the energy storage device 110, and returns to ground through a current-sensing resistor 150. The voltage drop across the resistor 150 (referred to as $V_f$ or feedback voltage) is equal to the resistance value of the resistor 150 ($R_{250}$) multiplied by the charging current $I_c$. Thus, $V_f = I_c * R_{150}$. Note that the voltage $V_f$ is fed back to the inverting input 123 of the differential high-gain device 120. The discussion below explains how generation of the voltage $V_f$ and feeding this voltage back to the input 123 provide a feedback mechanism that allows the circuit 100 to control and limit the charging current $I_c$ flowing into the energy storage device 110.

As the current $I_c$ increases, the feedback voltage, $V_f$ also increases. At a point where $V_f$ is approximately equal to $V_c$, the differential high-gain device 120 begins to drive its output 121 to a low voltage state, gradually turning the switching device 180 off and reducing or cutting off the charging current $I_c$. The charging current $I_c$ will thus be limited to a value $I_l$, which can be determined from formula (1) below:

$$I_l = \frac{V_{cc} * R_{135}}{R_{150} * (R_{130} + R_{135})}. \quad (1)$$

As a person skilled in the art would recognize, equation (1) immediately above ignores certain second- and higher-order effects, such as the effect of the input offset voltages of the differential high-gain device 120. The equation may also not apply during a brief settling period immediately after the power supply 160 is turned on.

If the power supply 160 fails and becomes incapable of providing a current $I_{supply}$ to a load 199 connected to it, the energy storage-device 110 takes over the function of providing $I_{supply}$ to the load. While the energy storage device 110 discharges, the control voltage $V_c$ exceeds the feedback voltage $V_f$, so that the switching device 180 remains in the conductive state and the circuit 100 continues to function as expected. This document will refer to operation during periods when the power supply 160 fails as operation during discharge cycles.

In the circuit 100 illustrated in FIG. 1, the differential high-gain device 120 is a CMOS operational amplifier (op amp). CMOS technology enables the op amp to provide high input impedances at its inputs 122 and 123, minimizing the distortion of the control voltage $V_c$ and the negative feedback voltage $V_f$ due to input leakage currents. In this way, relatively large values of the resistors 130 and 135 can be selected to lower the stand-by current draw. In other variants of the circuit 100, the device 120 is implemented as a bipolar operational amplifier, a comparator, a switch, a discrete transistor circuit, or another electronic circuit. In the illustrated embodiment, the switching device 180 is a power metal oxide semiconductor field-effect transistor (MOSFET) capable of switching on and off the relatively large charging current $I_c$. In other embodiments, the switching device 180 is implemented as a bipolar transistor, an analog semiconductor switch, or an equivalent or similar device.

Source resistance seen by the load 199 during the discharge cycles includes (and is approximated by) the resistance of the resistor 150. It is generally desirable to minimize this resistance. For a given, design with predetermined $I_l$ (the maximum value of the charging current) and $V_{cc}$ the value of the resistor 150 can be determined by re-writing formula (1) as follows:

$$R_{150} = \frac{V_{cc}}{I_l} * \left( \frac{R_{135}}{R_{130} + R_{135}} \right). \quad (2)$$

Formula (2) indicates that in order to minimize the source resistance of the circuit 100, the ratio $$\left( \frac{R_{135}}{R_{130} + R_{135}} \right)$$

of the resistive voltage divider should be minimized. The ratio, however, cannot be made arbitrarily small: it is limited by the magnitude and variability of the input offset voltage of the differential high-gain device 120. The offset voltage ideally should be much smaller (e.g., by a factor of about 10) than the control voltage $V_c$. Practically, the control voltage $V_c$ can be set to about 10 mV for a conventional comparator or op amp used as the device 120, and to about 1 mV for a low offset device. To allow further decreases in the control voltage $V_c$, precision, temperature stable components can be used for resistors 130 and 135.

Figure 2:
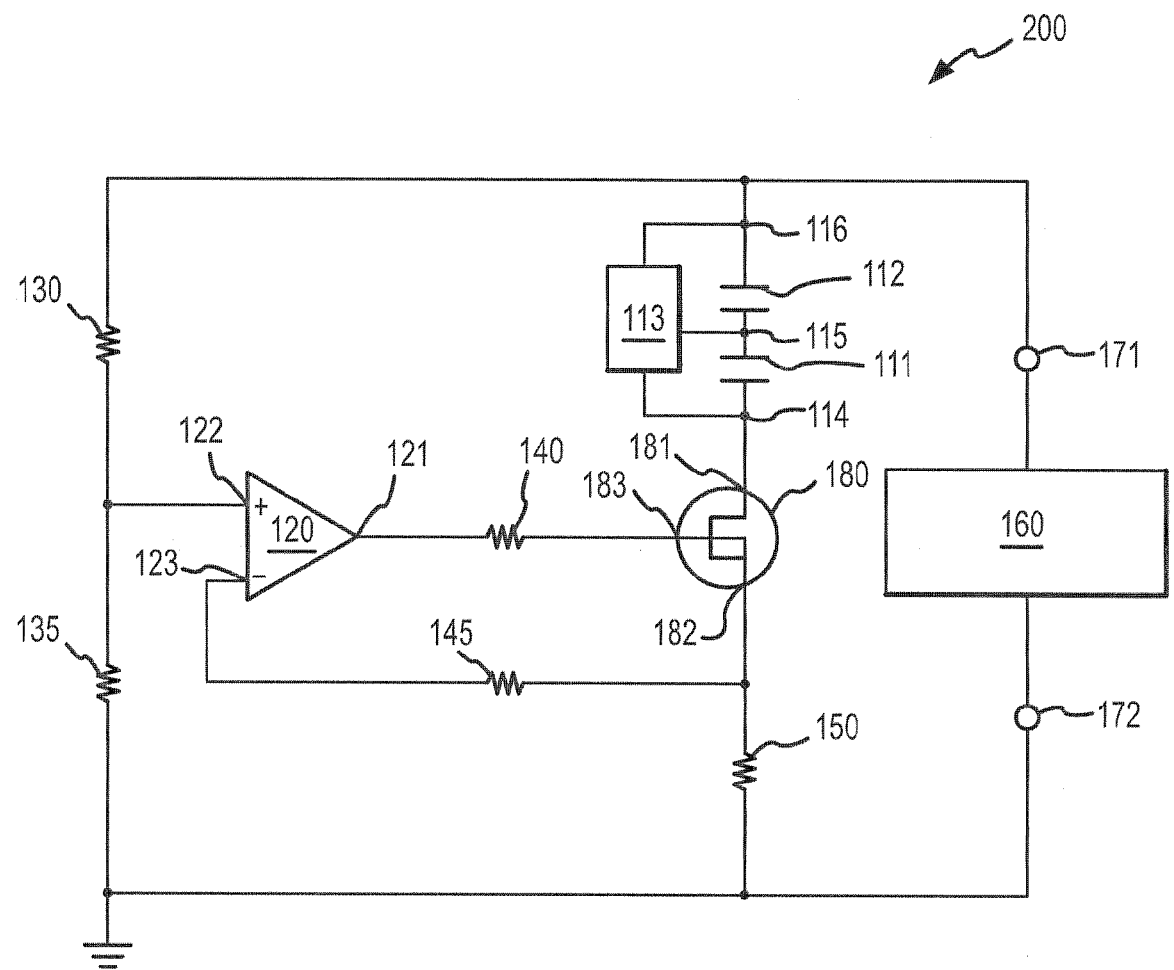
FIG. 2 is a high-level illustration of a circuit of FIG. 1 using a cell balancer and a pair of double layer capacitors.

The energy storage device 110 need not be limited to a single capacitor or cell. For example, several cells can be connected in series to boost the voltage capability of the device. In the case of double layer capacitors that can be provided with a high capacitance (for example, in range of 1-5000 Farads) and small form factor, the typical nominal operating voltage is on the order of about 3 volts or less. For double layer capacitors to be used in higher voltage applications, one or more capacitor can be connected in series. In some applications, the voltages across series connected capacitors may need to balanced. Several capacitor cell voltage balancing circuits are known to those skilled in the art, and others of a novel nature are described in a commonly-assigned U.S. application Ser. Nos. 10/423,708, 10/498,197, and 60/518,052, which are hereby incorporated by reference in their entirety. To illustrate this concept, FIG. 2 shows a circuit 200 that includes two series connected double-layer capacitors 111 and 112, and a cell balancer 113. Although circuit 200, as well as others described further herein, are described as utilizing capacitor technology, it is understood that the present invention should not limited thereby, as it is envisioned that other energy storage devices could be utilized, for example, secondary batteries and other types of rechargeable cells.

Figure 3:
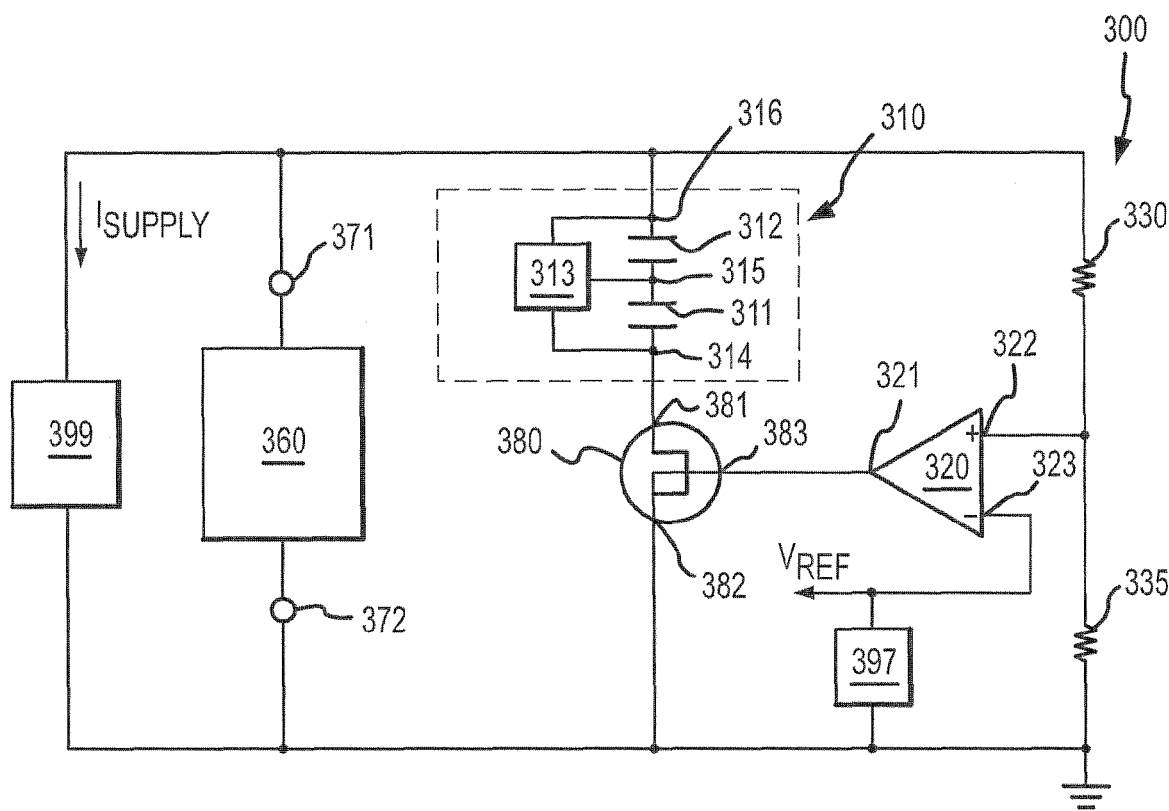
FIG. 3 is a high-level illustration of a circuit for connecting an energy storage element in parallel with a power supply, in accordance with the present invention.

FIG. 3 is a high-level illustration of a circuit 300 for connecting an energy storage element 310 in parallel with a power supply 360. In one embodiment, the energy storage element 310 comprises voltage balancer 313 and a series combination of capacitors 311 and 312.

In the circuit 300, the energy storage element 310 is coupled in series with a switching device 380; the series combination of the device 380 and the element 310 is coupled across the power supply 360, so that the charging current of the energy storage element 310 flows through and is controlled by the switching device 380. The switching device 380 is, in turn, controlled by a voltage at its input 383, driven by output 321 of a differential high-gain device 320. Inverting input 323 of the device 320 is biased by a reference voltage $V_{ref}$ provided by a reference voltage source 397, for example, a temperature-compensated precision voltage reference. Non-inverting input 322 of the comparator 320 receives a control voltage $V_c$, which is monotonically related to the voltage across the terminals 371/372. In this embodiment, the control voltage $V_c$ is generated by a voltages divider formed by resistors 330 and 335. The control voltage $V_c$ is equal to $$\left(\frac{V_{cc} \times R_{335}}{R_{330} + R_{335}}\right).$$

($V_{cc}$ denotes the power supply voltage across terminals 371 and 372.) Thus, the comparator 320 keeps the switching device 380 in the off or non-conducting state until $$\left(\frac{V_{cc} * R_{335}}{R_{330} + R_{335}}\right)$$

exceeds $V_{ref}$. At approximately that point, the differential high-gain device 320 begins to turn on the switching device 380, and allows some charging current to flow into and charge the energy storage element 310. The values of $V_{ref}$, $R_{330}$, and $R_{335}$ are chosen so that the turn-on point ($V_{on}$) is set below the normal operating range of the power supply 360, but above the minimum voltage level required by load 399 powered by the supply 360. In a 5 volt design, for example, $V_{on}$ can be set to about 4.75 volts. The relationship of $V_{on}$, $V_{ref}$, $R_{330}$, and $R_{335}$ is governed by the following equation:

$$V_{on} = \frac{V_{ref} * (R_{330} + R_{335})}{R_{335}}. \quad (3)$$

After the voltage level of the power supply 360 reaches $V_{on}$, the circuit 300 allows the energy storage element 310 to draw enough current to keep the voltage level of the supply 360 substantially at $V_{on}$, in effect charging the energy storage element 310 with a current that is close to the excess current available from the power supply 360 after providing the $I_{supply}$ current to the load 399. Thus, on power-up the energy storage element 310 remains substantially discharged until the power supply voltage reaches the operating level required by the load 399; from that point on, the energy storage element 310 is charged at substantially the highest rate that the power supply can deliver. Eventually, the energy storage element 310 becomes fully charged, and only leakage current flows through the series combination of the element 310 and the switching device 380.

Let us next turn to the description of the specific components used in the circuit 300. The switching device 380 and the comparator 320 are similar to the devices 180 and 120, respectively, of the previously-described embodiments. In some variants of the circuit 300, the reference voltage source 397 is provided on the same integrated circuit (IC) as the device 320. A simple voltage divider can also be used as the source 397. As regards the resistors 330 and 335, in some variants of the circuit 300 they are high-precision, temperature stable resistors.

Note that a jumper can be substituted for the resistor 330 (0 ohm resistance), while the resistor 335 can be removed altogether (open circuit with infinite resistance).

Figure 4:
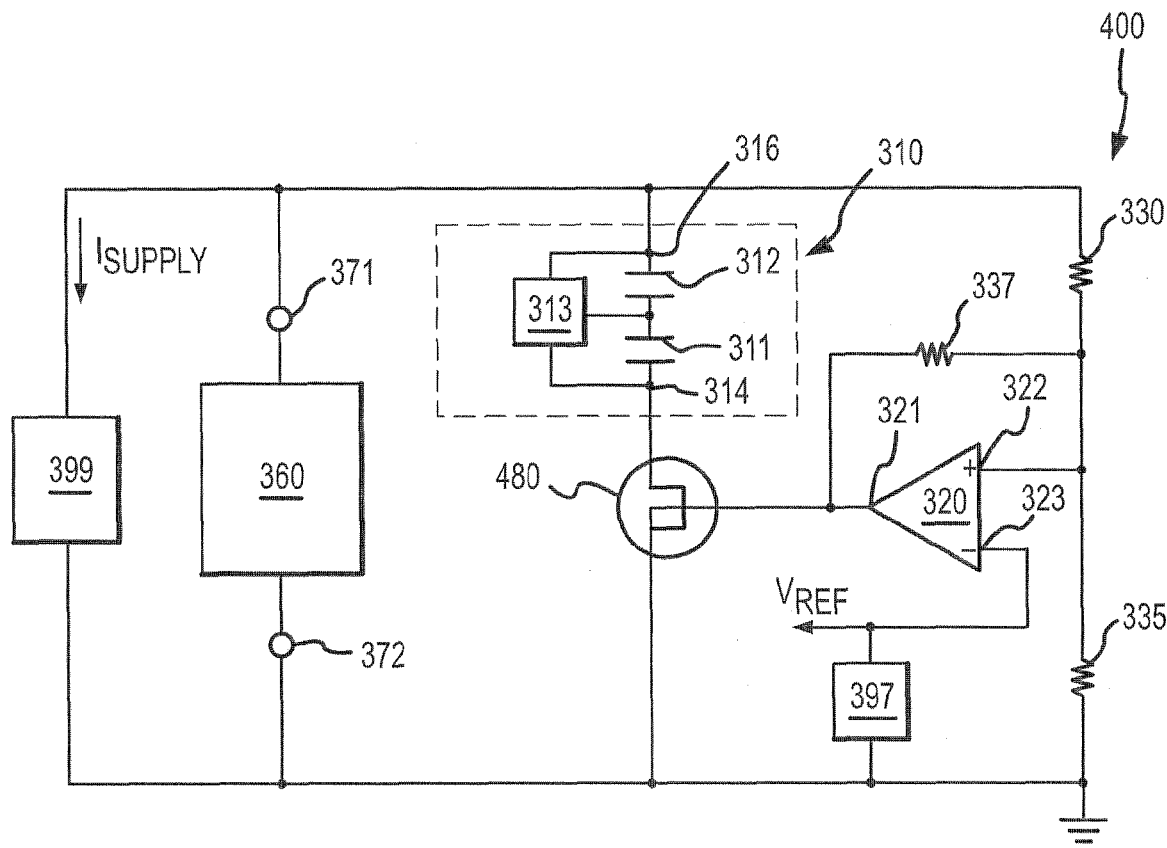
FIG. 4 is a high-level illustration of another circuit for connecting an energy storage element in parallel with a power supply, in accordance with the present invention.

FIG. 4 is a high-level illustration of a circuit 400 in accordance with the present invention. The circuit 400 is similar to the circuit 300 of FIG. 3, but also includes a resistor 337 coupled between the noninverting input 322 and the output 321 of the comparator 320. This resistor portion of the circuit provides positive feedback within the circuit, resulting in hysteresis in turning the switching device 380 on and off. The hysteresis allows the circuit 400 to begin charging the energy storage element 310 when the voltage of the power supply ramps-up to a turn-on voltage value $V_{on}$, which is higher than a voltage $V_{off}$ at which the circuit 400 disconnects the energy storage element 310 during discharge cycles.

Two simplifying assumptions help in analyzing the performance of the circuit 400. First, we assume that the output 321 of the comparator 320 is driven between substantially ground potential and the potential of the voltage across the power supply terminals 371/372. Second, we assume that the resistance of the switching device 380 in a conductive state is substantially zero. Next, we define $C_{on}$ and $C_{off}$ as the ratios of $V_{on}$ and $$V_{off} \text{ to } V_{ref}, \quad C_{on} = \frac{V_{on}}{V_{ref}}, \quad C_{off} = \frac{V_{off}}{V_{ref}}.$$

With these assumptions and definitions, we can choose a value for one of the resistors 330, 335, or 337, and solve a set of two simultaneous non-linear equations to express the values of the remaining two resistors in terms of (1) the chosen resistor value, (2) $C_{on}$, and (3) $C_{off}$. Here, we simply present expressions for $R_{335}$ and $R_{337}$ in terms of $R_{330}$, omitting their derivation for brevity:

$$R_{335} = \frac{C_{off} * R_{330}}{C_{on} * (C_{off} - 1)}, \quad \text{and} \quad (4)$$

$$R_{337} = \frac{C_{off} * R_{330}}{C_{on} - C_{off}}. \quad (5)$$

Let us go through a numerical example to clarify the above results. Suppose the circuit is to be designed using a voltage reference generating $V_{ref}$ of 4.0 volts ($V_{ref}$=4.0), so that the energy storage device 360 begins to charge when the power supply voltage reaches 4.8 volts ($V_{on}$=4.8), and the energy storage element 360 is cutoff from the load when the voltage reaches 4.4 volts ($V_{off}$=4.4) Given these values we calculate $C_{on}$ and $C_{off}$.

$$C_{on} = \frac{V_{on}}{V_{ref}} = \frac{4.8}{4.0} = 1.2, \quad \text{and}$$

$$C_{off} = \frac{V_{off}}{V_{ref}} = \frac{4.4}{4.0} = 1.0.$$

After choosing 10 KΩ for $R_{330}$, we can calculate $R_{335}$ and $R_{337}$ as follows:

$$R_{335} = \frac{C_{off} * R_{330}}{C_{on} * (C_{off} - 1)} = \frac{1.1 * 10 \text{ K}\Omega}{1.2 * (1.1 - 1)} = 91.67 \text{ K}\Omega, \quad \text{and}$$

$$R_{337} = \frac{C_{off} * R_{330}}{C_{on} - C_{off}} = \frac{1.1 * 10 \text{ K}\Omega}{1.2 - 1.1} = 110 \text{ K}\Omega.$$

It can be easily verified that, using the above values, the voltage at the input 322 will be 4.0 volts when (1) $V_{cc}$=4.8 volts on ramp-up, and (2) $V_{cc}$=4.4 volts during discharge.

Figure 5:
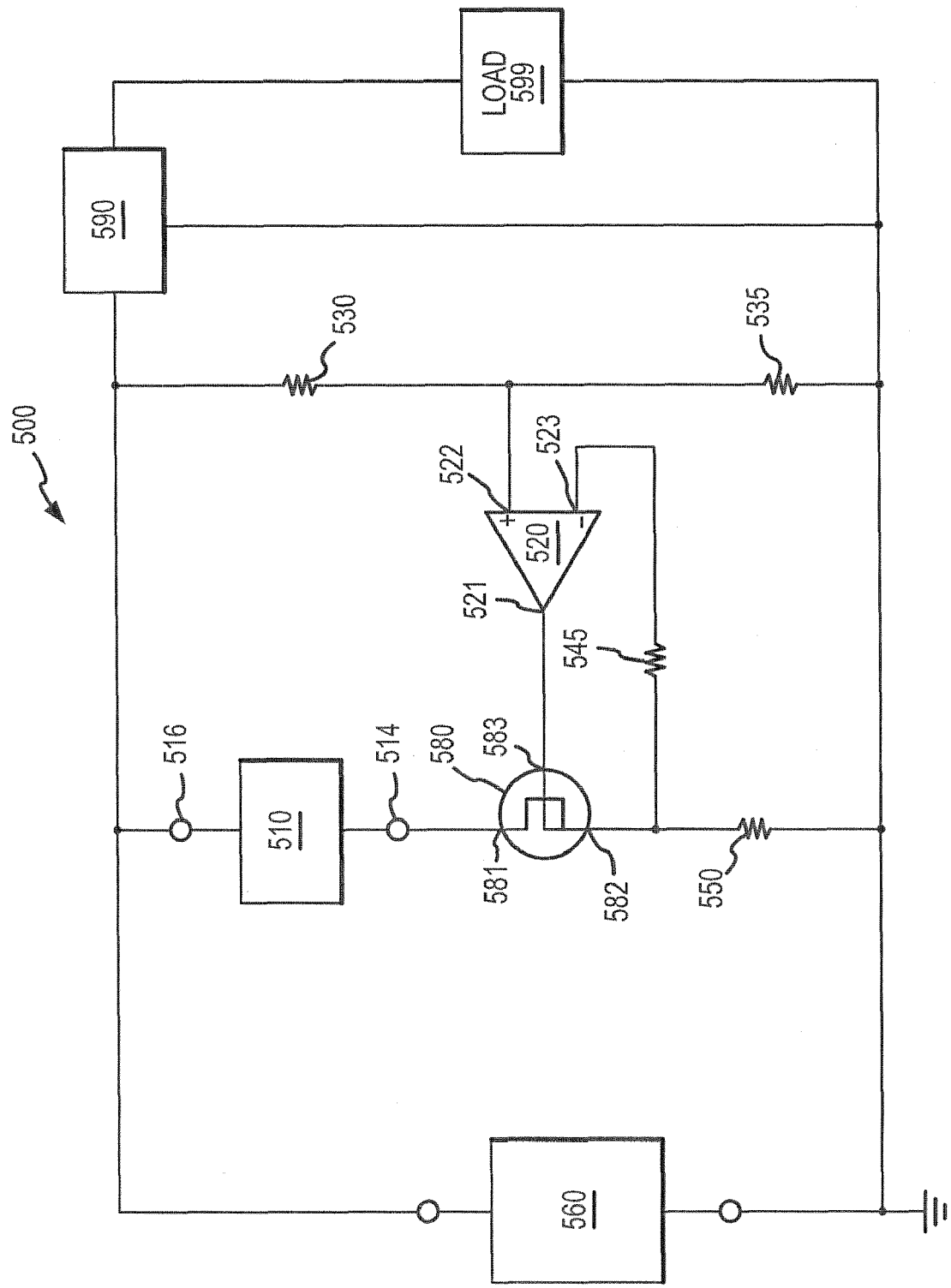
FIG. 5 is a high-level illustration of a current-limiting circuit capable of enhancing power supply ride-through performance, in accordance with the present invention.

The circuits described above can be coupled with a voltage regulator or a DC-to-DC converter to provide longer ride-through periods. FIG. 5 illustrates a circuit 500 implementing one such arrangement.

Most components of the circuit 500 are similar or identical to components of the circuit 100 of FIG. 1, and are interconnected in the same fashion. In one variation, circuit 500 does not have an optional current limiting resistor between an output 521 of a differential high-gain device 520 and control input 583 of a switching device 580, such as the resistor 140 in FIG. 1. Second, power supply 560 of the circuit 500 does not power the load directly, but through a second power supply 590. In the illustrated embodiment, the power supply 590 is a 5 volt regulator, while the power supply 560 is a 12 volt supply. In other variants, the supply 590 is a high-efficiency DC-to-DC voltage converter.

Operation of the circuit 590 is predictable from the discussion relating to the circuit 100. On power-up, the circuit 500 prevents the current charging the energy storage device 510 from exceeding a limit current $I_l$, which can be determined from this equation:

$$I_1 = \frac{V_{cc} * R_{535}}{R_{550} * (R_{530} + R_{535})}. \tag{6}$$

The last equation is the same as equation (1), with reference numerals of FIG. 5 substituted for those of FIG. 1. Once voltage of the 12 volt supply 560 exceeds the operating voltage of the supply 590 by a specified regulator drop-off voltage, the supply 590 provides its nominal output voltage to a load 599. A regulator's drop-off voltage is typically of the order of 0.5 volts, with low drop-off regulators offering even lower drop-off voltages.

If the output voltage of the supply 560 drops fails, the energy storage element 510 begins to provide power to the supply 590, which continues to power the load 599. As the energy storage element 510 discharges, its voltage also drops, but remains sufficient for the supply 590 to function normally for a period of time. The length of the period of time is of course a measure of the ride-through capability offered by the circuit 500.

The ride-through period provided by the circuit 500 is extended because of the relatively large difference between the operating voltages of the power supplies 560 and 590. The voltage difference is 7 volts in this example, but need not be limited to any particular number. When the energy storage element 510 is a capacitor (or a combination of several capacitors), the ride-through period is extended even more effectively than when the energy storage is provided by a battery. The reason for this enhanced ride-through capability is that the discharge curve for a capacitor under a constant current load is a straight line. In contrast, a battery's voltage remains relatively constant until late in the discharge cycle, and then drops abruptly. Because the circuit 500 allows a capacitor used as the energy storage element 500 to discharge more deeply, it uses a higher proportion of the energy stored in the capacitor for ride-through enhancement.

Figure 6:
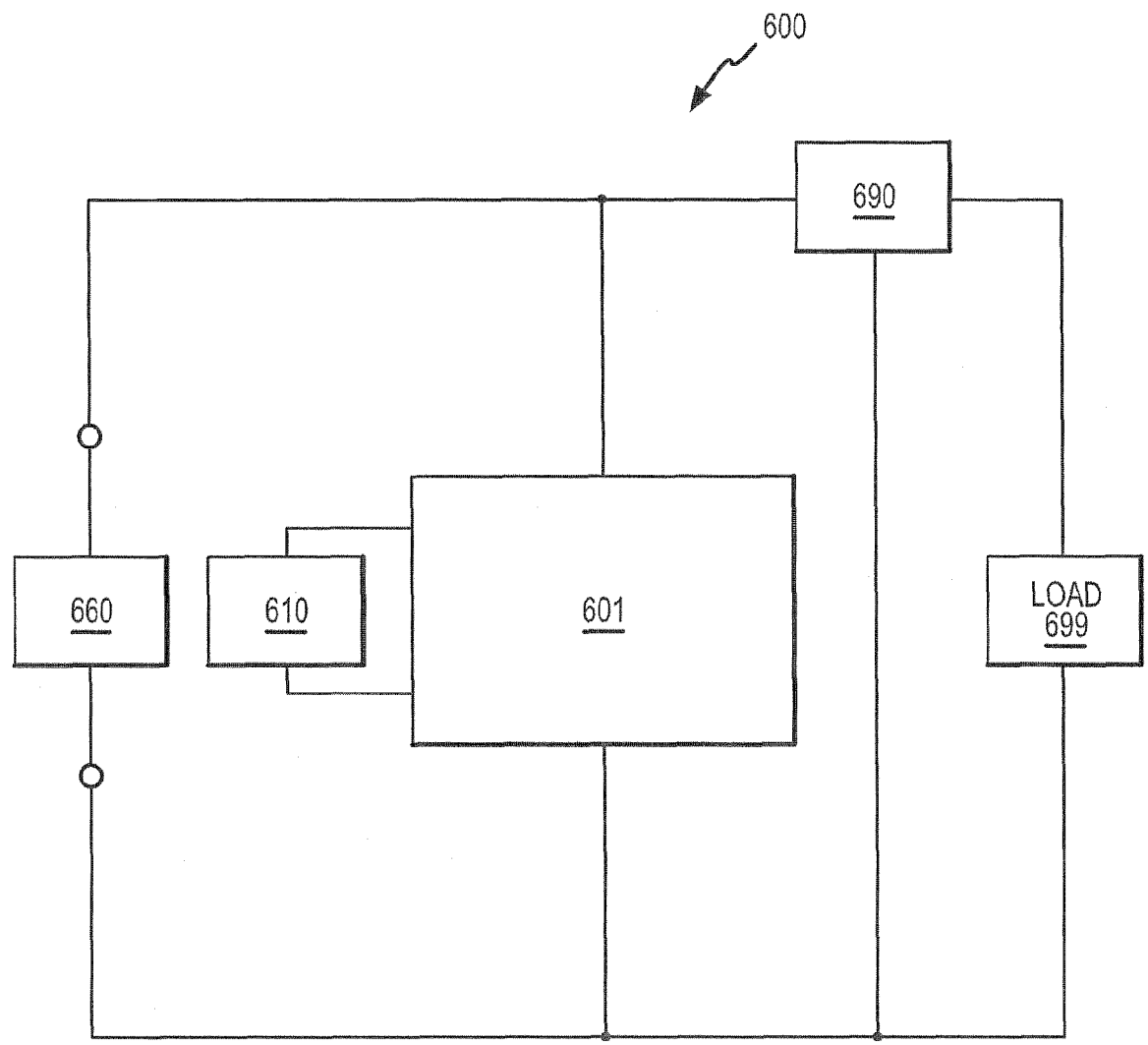
FIG. 6 is a high-level schematic diagram of a generalized current-limiting circuit capable of enhancing power supply ride-through performance, in accordance with the present invention.

The principles underlying enhanced ride-through protection provided by the circuit 500 are not limited to the use of a variant of the basic current limiting circuit 100 in combination with dual power supplies. In fact, dual power supplies can be used with any of the other circuits described in this document, and with other equivalent or similar circuits. FIG. 6 illustrates, in a high-level manner, such generalized arrangement of a current limiting circuit 601, high voltage power supply 660, low voltage power supply 690, and energy storage element 610.

This document describes in considerable detail the inventive circuits and methods for limiting charging currents drawn from power supplies, and for enhancing power supply ride-through capability. This was done for illustration purposes only. Neither the specific embodiments of the invention as a whole, nor those of its features limit the general principles underlying the invention. In particular, the invention is not limited to the specific components and component values described, or to particular applications. The specific features described herein may be used in some embodiments, but not in others, without departure from the spirit and scope of the invention as set forth. Many additional modifications are intended in the foregoing disclosure, and it will be appreciated by those of ordinary skill in the art that in some instances some features of the invention will be employed in the absence of a corresponding use of other features. The illustrative examples therefore do not define the metes and bounds of the invention and the legal protections afforded the invention, which function is served by the claims and their equivalents.

I claim:

1. A system for use with a power supply, comprising:
   two double-layer capacitors, the two double-layer capacitors operatively coupled to output terminals of the power supply, wherein each double-layer capacitor comprises a capacitance of greater than or equal to 1 Farad;
   a voltage balancing circuit; the voltage balancing circuit operatively coupled to the two double-layer capacitors to balance a power supply voltage applied to the two capacitors; and
   a current control device, the current control device including a feedback portion, the current control device coupled to output terminals of the power supply, wherein the current control device controls current flowing through the two double-layer capacitors according to a signal provided by the feedback portion.

2. The system of claim 1, wherein the feedback portion is operatively coupled to the voltage balancing device so as to provide a positive feedback signal to the voltage balancing device.

3. The system of claim 1, wherein the feedback portion is operatively coupled to the voltage balancing device so as to provide a negative feedback signal to the voltage balancing device.

* * * * *